United States Patent
Upadhyaya et al.

(10) Patent No.: US 10,221,485 B2
(45) Date of Patent: Mar. 5, 2019

(54) HIGH ENERGY DENSITY SOLID STATE LITHIUM ION BATTERY WITH FAIL-SAFE

(71) Applicant: KalpTree Energy, Inc., Pleasanton, CA (US)

(72) Inventors: Deepak Upadhyaya, Fremont, CA (US); Mark J. Isaacson, Santa Clara, CA (US)

(73) Assignee: Adavolt, Inc., Livermore, CA (US)

( * ) Notice: Subject to any disclaimer, the term of this patent is extended or adjusted under 35 U.S.C. 154(b) by 0 days.

(21) Appl. No.: 14/593,797

(22) Filed: Jan. 9, 2015

(65) Prior Publication Data
US 2015/0221973 A1    Aug. 6, 2015

Related U.S. Application Data

(60) Provisional application No. 61/925,528, filed on Jan. 9, 2014.

(51) Int. Cl.
*H01M 10/04* (2006.01)
*H01M 10/0562* (2010.01)
(Continued)

(52) U.S. Cl.
CPC ............ *C23C 16/46* (2013.01); *C23C 16/545* (2013.01); *H01M 2/105* (2013.01); *H01M 2/1077* (2013.01); *H01M 2/34* (2013.01); *H01M 4/0428* (2013.01); *H01M 4/13* (2013.01); *H01M 4/139* (2013.01); *H01M 4/382* (2013.01); *H01M 4/62* (2013.01); *H01M 4/661* (2013.01);
(Continued)

(58) Field of Classification Search
CPC ...................... H01M 10/0422; H01M 10/0562

USPC ............................................................. 429/94
See application file for complete search history.

(56) References Cited

U.S. PATENT DOCUMENTS

| | | |
|---|---|---|
| 2,734,478 A | 2/1956 | Reynolds et al. |
| 3,542,604 A | 11/1970 | Arrance et al. |
| | (Continued) | |

FOREIGN PATENT DOCUMENTS

JP    2010-129412    *  6/2010    ............ H01M 10/04

OTHER PUBLICATIONS

Printout: E.F. Vaage, "Transmission Properties of Laminated Clogston Type Conductor", Manuscript Dec. 8, 1952, pp. 695-713.

*Primary Examiner* — Osei K Amponsah
(74) *Attorney, Agent, or Firm* — Thomas Schneck

(57) ABSTRACT

Electrochemical cells for a lithium-ion battery are formed on a conductive wire substrate drawn through a multi-chamber deposition reactor, then assembled together in series and parallel connection to create a fail-safe battery. The wire substrate acts as current-limiting fuse that melts when there is a short affecting that cell, while remaining cells of the battery continue to operate. Each cell has solid-state thin film layers concentrically nucleated and grown over a length of the wire substrate as it is drawn through the successive deposition sections, including at least a first electrochemical active material layer, ion-exchange material layer, a second electrochemical active material layer, which is followed by deposition of a conductive layer forming an outer current collector and hermetic seal for the cell. The active material layers form electrodes (cathode and anode), wherein the anode may be formed as a multi-layer composite with stress-absorbing compliant layers.

20 Claims, 7 Drawing Sheets

(51) Int. Cl.
| | |
|---|---|
| *H01M 4/133* | (2010.01) |
| *H01M 4/134* | (2010.01) |
| *H01M 4/04* | (2006.01) |
| *H01M 4/1391* | (2010.01) |
| *H01M 4/131* | (2010.01) |
| *H01M 4/136* | (2010.01) |
| *C23C 16/46* | (2006.01) |
| *H01M 2/10* | (2006.01) |
| *H01M 2/34* | (2006.01) |
| *H01M 4/13* | (2010.01) |
| *H01M 4/139* | (2010.01) |
| *H01M 4/38* | (2006.01) |
| *H01M 4/62* | (2006.01) |
| *H01M 4/66* | (2006.01) |
| *H01M 4/75* | (2006.01) |
| *H01M 10/052* | (2010.01) |
| *H01M 10/058* | (2010.01) |
| *C23C 16/54* | (2006.01) |
| *H01M 4/1395* | (2010.01) |
| *H01M 4/1397* | (2010.01) |
| *H01M 4/36* | (2006.01) |
| *C23C 16/455* | (2006.01) |

(52) U.S. Cl.
CPC ............. *H01M 4/667* (2013.01); *H01M 4/75* (2013.01); *H01M 10/052* (2013.01); *H01M 10/058* (2013.01); *H01M 10/0562* (2013.01); *C23C 16/45519* (2013.01); *H01M 4/131* (2013.01); *H01M 4/134* (2013.01); *H01M 4/136* (2013.01); *H01M 4/1391* (2013.01); *H01M 4/1395* (2013.01); *H01M 4/1397* (2013.01); *H01M 4/366* (2013.01); *H01M 2200/103* (2013.01); *H01M 2300/0068* (2013.01)

(56) References Cited

U.S. PATENT DOCUMENTS

| | | | |
|---|---|---|---|
| 3,562,002 | A | 2/1971 | Smith, Jr. |
| 7,351,449 | B2 | 4/2008 | Hunt et al. |
| 7,717,968 | B2 | 5/2010 | Kalynushkin et al. |
| 8,993,172 | B2 | 3/2015 | Upadhyaya |
| 2003/0068559 | A1* | 4/2003 | Armstrong ............... B32B 5/02 429/234 |
| 2008/0268343 | A1 | 10/2008 | Sato et al. |
| 2010/0261071 | A1* | 10/2010 | Lopatin ................. H01M 4/133 429/345 |
| 2014/0178753 | A1* | 6/2014 | Chu ........................ H01M 4/13 429/211 |

\* cited by examiner

HIGH ENERGY DENSITY SOLID STATE LITHIUM ION BATTERY WITH FAIL-SAFE

CROSS-REFERENCE TO RELATED APPLICATION

This application claims priority under 35 U.S.C. 119(e) from U.S. provisional application 61/925,528, filed Jan. 9, 2014.

TECHNICAL FIELD

The present invention relates to lithium-ion batteries, their component electrochemical cells, and the apparatus and methods of making such cells.

BACKGROUND ART

Solid state lithium ion batteries (SSB) with solid inorganic electrolytes are used in sensors, medical devices and other micro-electronic systems. SSBs have also been considered for use in electric vehicles as well as portable and wearable electric devices and power tools but currently lack the energy density necessary for those applications. Similar to traditional lithium ion batteries (LIB), solid state LIBs batteries consist of an anode, a cathode and an electrolyte. The active components for SSBs are intercalation compounds that are chemically similar to those employed in traditional lithium ion batteries. In a SSB battery a thin-film solid electrolyte acts as both separator and electrolyte. A discrete separator between the anode and the cathode is not required because the solid-state thin film electrolyte functions as both an ion conductor and a mechanically robust electronic insulator. This reduces cost as well as mass since the separator is one of the largest materials costs in a traditional LIB cell. In general, SSBs offer fast charge and discharge rates and high cycle life with little capacity fade. Furthermore, SSBs operate over a much wider temperature range than LIBs with cycling performance reported from −40 to 150° C. However, SSBs are difficult to scale up to large capacities and suffer from low energy density and lack of flexibility making them unsuitable for large scale applications such as electric vehicles, wearable devices and power tools. Thus, there is a need to for a safe, high energy density of SSB while maintaining high charge and discharge rates, long life and a wider operating temperature range. The present invention provides this solution.

SUMMARY DISCLOSURE

The present invention teaches a fabrication and assembly method for a high energy density solid state lithium ion battery where an integrated thermal shutoff switch based fail-safe mechanism can be applied. In particular, an electrochemical cell comprises a conductive wire substrate forming an inner current collector with successive solid-state thin films concentrically nucleated and grown over a length of the wire substrate so as to respectively form at least a first electrode layer of a selected first electrochemical active material, a solid-state electrolyte layer of selected ion exchange material and a second electrode layer of a selected second electrochemical active material. An electrically conductive layer concentrically deposited over the second electrode layer forms an outer current collector and also serves to hermetically seal the cell. Depending on the respective choices of active material, the first electrode could be a cathode and the second electrode could be an anode, or vice versa. The anode may be formed as a multi-layer microstructure of selected lithium-receptive active materials, one of which may also serve as volume stress-absorbing compliant material.

Multiple cells are bundled together with both serial connections to obtain a desired voltage and parallel connections to obtain a desired charge-discharge rate and overall capacity. The conductive wire substrate may have a positive temperature coefficient resistance selected such that the wire substrate will melt and create an open circuit at some specified threshold current density, thereby acting as a current limiting fuse for that cell. Other remaining cells bundled into the battery would continue to operate, producing a fail-safe mechanism for the battery as a whole.

The electrochemical cells may be formed by continuously drawing the wire substrate through a deposition apparatus comprising a reactor with multiple deposition chamber sections for successive deposition of the concentric layers, e.g. by thermally activated chemical vapor deposition (TACVD). A wire supply spool, wire take-up spool and a tensioner draw the wire at a specified speed through the deposition chamber sections of the reactor, while a pair of electrical contacts applies electrical current through the wire substrate in order to heat it to a specified deposition temperature. Gas supply and exhaust ports associated with each chamber respectively supply thermal chemical vapor deposition reactant gases and inert gases and remove any remnant reaction products in order to nucleate and concentrically grow the various successive layers. One or more sections might also employ other deposition techniques (e.g. metal vapor deposition, such as to form the outer current collector). The respective lengths of each chamber section, as well as the reactant and inert gas supply rates, are selected to obtain a desired film thickness for each of the layers.

DETAILED DESCRIPTION

Figure 1:
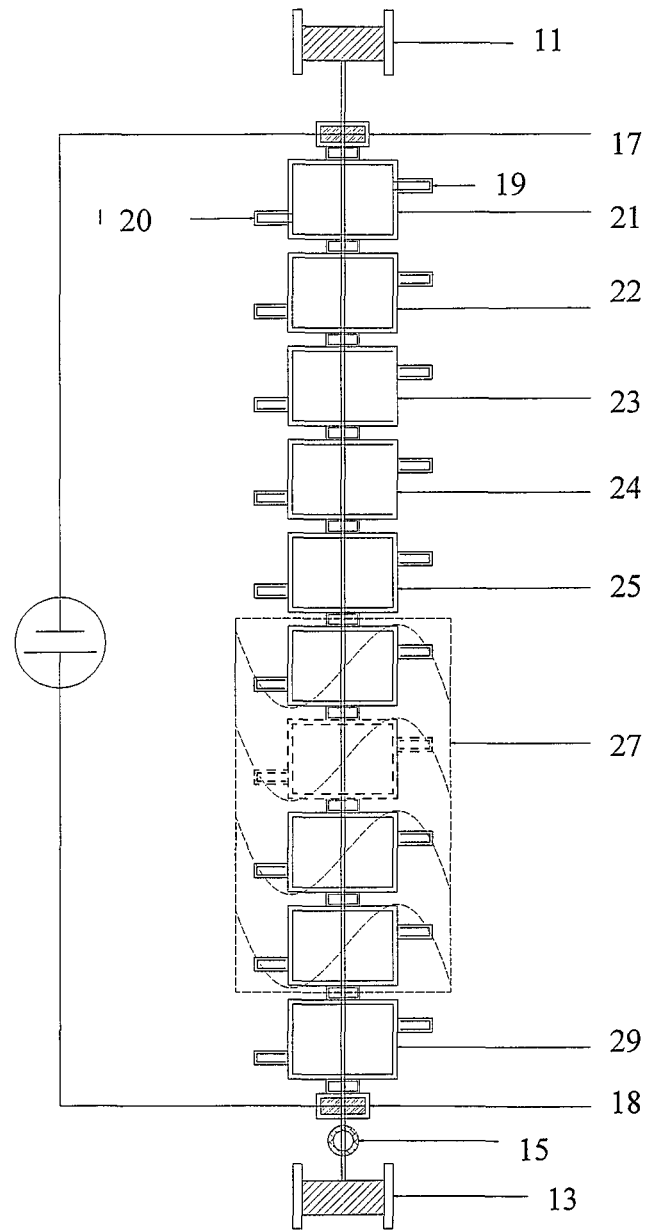
FIG. 1 is a schematic plan view of a thermal vapor deposition reactor with multiple deposition chambers connected in series and isolated from ambient to fabricate a solid state electrochemical cell.

An embodiment of the present invention relates to using a thermally activated chemical vapor deposition process (TACVD) to nucleate and sequentially grow concentric layers of cathode, electrolyte, anode and anode current collector onto an electrically conductive solid substrate with a circular cross-section. The electrically conductive wire substrate acts as a current collector for a first electrochemical electrode, such as for the cathode, during battery charging and discharging. In this invention, deposition of the anode layer onto the electrolyte layer allows outwardly volumetric expansion of anode constituents, for example during the intercalation—deintercalation processes. However, there may be other cases where it is desirable to have the anode as the innermost electrode with the cathode being formed over the electrolyte layer. An advantage of concentric layer deposition over a circular substrate is that it minimizes mechanical stress non-uniformities within the deposited material as compared to the planar substrates used in traditional SSBS fabrication. The cylindrical structure eliminates the edge effects and stress concentrations common in planar anode structures (i.e., lower compressive stress level in the film stack for the cylindrical geometry as compared to the planar geometry) and thus helps minimize battery capacity fade and maximize battery cycle life.

In a typical case, the conductive wire substrate may have a circular cross-section characterized by a diameter in a range between 15 μm and 150 μm, with a more preferred range between 20 μm and 40 μm. An (optional) adhesion and reaction/diffusion barrier layer may be formed over the substrate before growing the first electrochemical electrode (either cathode or anode). Such a barrier layer may be a metal or alloy material selected, for example, from any one or more of silicon (Si), tungsten (W), titanium (Ti), nickel (Ni), copper (Cu), or iron (Fe). It might also be formed as a reaction product of the wire substrate and first thin-film materials.

The overlying material layers are composed solid-state materials that can be deposited in a reactor apparatus, either by metal vapor deposition or more preferably by thermally activated chemical vapor deposition. As lithium-ion battery technology develops and new electrochemical reaction systems are developed, or the deposition techniques develop to allow other materials to be deposited, the range of possible layer materials may expand from those currently known.

Currently, the electrochemical active material that composes the cathode layer may be selected from a variety of known materials, including any of various compounds such as $LiTiS_2$, $LiFeS_2$, $LiV_2O_5$, lithium-doped $M_xO_y$, $LiMO_2$, $LiM_2O_4$, $LiMPO_4$, $LiMSiO_4$, where M is any or a combination of the metallic elements selected from nickel (Ni), cobalt (Co), iron (Fe), manganese (Mn), vanadium (V), titanium (Ti) and aluminum (Al), and wherein x>1 and y>1. For example, for a $V_2O_5$ based cathode, vanadium oxychloride ($VOCl_3$) and oxygen may be used as the reactants. Vanadium oxychloride is a liquid at room temperature but is readily vaporized. An inert carrier gas, such as argon or nitrogen, may be used with the vaporized reactant carrier. Lithium tert-butoxide ($LiOC(CH_3)_3$) powder that is sublimated may be used as the lithium source for the cathode. For $LiCoO_2$ based cathodes, cobalt(III) acetylacetonate and oxygen may be used, along the aforementioned lithium tert-butoxide. For $LiFePO_4$ based cathodes, triethyl phosphine (($CH_3CH_2)_3P$) and an iron-containing precursor such as bis(cyclo-pentadienyl) iron can be used.

Ion exchange material for the solid-state electrolyte layer may comprise, for example, any of $LiTiS_2$, $LiSiS_2$, $Li_2PO_2N$, $LiBH_4$ and $LiBH_4N$, or indeed any solid-state ion exchange material having a room temperature ionic conductivity greater than $5\times10^{-7}$ S/cm. When metal-containing sulfide based electrolytes doped with phosphorus are used, such as $TiS_2$ or $SiS_2$, the titanium or silicon precursors may comprise titanium tetrachloride or dichlorosilane, or another silane variant, while tetrabutyl disulfide may be used as the sulfur source and phosphoryl chloride ($O:PCl_3$) as the phosphorus source, together with inert carrier gas or reactant gas such as oxygen. For $Li_2PO_2N$ based electrolytes, triethyl phosphate carried by nitrogen may be used as the reactant. The lithium source may be the same lithium tert-butoxide used as precursor in the formation of the cathode.

The electrochemical active material that composes the anode layer may be selected from a variety of known lithium-receptive materials, including any of carbon (C), silicon (Si), SiC, $TiS_2$, $V_2O_5$, germanium (Ge), tin (Sn), antimony (Sb), bismuth (Bi), aluminum (Al), zinc (Zn) and silver (Ag). Also, the anode may be a composite microstructure, e.g. of one or more pairs of alternating layers, at least one layer of each pair being the aforementioned lithium-receptive active material and the other at least functioning as a compliant layer, e.g. of boron (B) or carbon (C), that absorbs volume-induced stresses. The compliant layer may also be electrochemically active. Also the anode may be composed of lithium metal. The individual layers in such a composite anode microstructure may have thicknesses in a range between 10 nm and 5 μm, and there may be up to about 10 pairs of alternating layers. Additionally, the anode microstructure layers may be formed as any of dense, porous, spherical or nanowire microstructures over the corresponding compliant layers. For silicon-carbon based anode structures, precursors containing silicon, such as dichlorosilane ($SiCl_2H_2$) or silane ($SiH_4$), and precursors containing carbon such as cyclohexane, acetylene or methyl acetylene, or precursors containing both carbon and silicon, such as methylsilane or tetramethylsilane, may be used.

The thicknesses of the respective thin films that form the active electrode layers (cathode and anode) and the intermediate electrolyte layer may be selected to obtain a specified charge-discharge rate for the electrochemical cell, as well as to obtain a specified ratio of cathode-to-anode capacity.

The outer current collector (and hermetic sealing layer) may be selected from a variety of conductive materials, including, for example, any of titanium (Ti), germanium (Ge), copper (Cu), aluminum (Al), tungsten (W), a silicide or carbide thereof, or even a conductive polymer. For aluminum collectors, aluminum tetrachloride or tributyl aluminum may be used as reactant precursors. For tungsten silicide based current collectors, a combination of tungsten hexafluoride and silane may be used. The cell as a whole should, ideally have a circular cross-section (for minimum stresses and absence of edge effects) and a length-to-diameter aspect ratio in excess of 4000:1.

The vertical TACVD tubular deposition apparatus (reactor) has a circular cross section with internal diameter ranging from 5 mm to 100 mm, FIG. 1. In this method, the substrate is continuously drawn through the multiple section deposition chambers 21-29. A wire supply spool 11 holds the bare conductive wire substrate and a motor-driven take-up spool 13 at the other end of the reactor receives the wire after the various thin-film layers have been deposited. At one or both ends of the reactor a tensioner 15 may be provided to keep the wire taut as it passes through the reactor. The unique design features of the reactor (e.g. small diameter and continuously moving substrate) reduce defects and increases deposit uniformity as flow effects are minimized. This level of uniformity is not possible with traditional physical, chemical, sol-gel or spray deposition methods. Depending upon the reaction precursor introduced within each apparatus section, a thin film is formed consisting of concentric layers in intimate contact.

Figure 2:
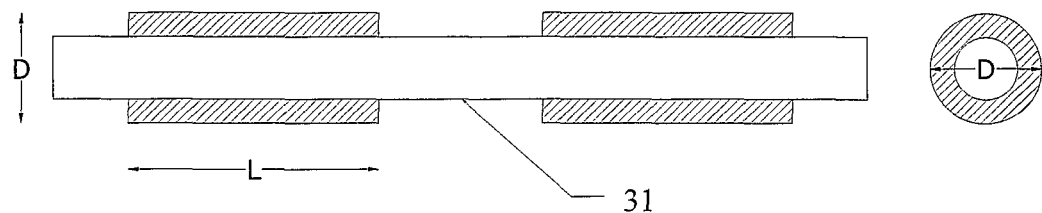
FIG. 2 shows side and end views of a thin film solid state battery with length to diameter ratio (L:D) greater than 4000:1

FIG. 2 depicts a continuous electrically conductive substrate moving through the deposition chamber(s) 21-29. The substrate is heated by passing electrical current through the substrate. For this purpose, the deposition apparatus may have a pair of electrical contacts 17 and 18 that are positioned for contact with the conductive wire substrate between the reactor and respective wire supply and take-up spools 11 and 13. The desired temperature range is controlled by varying the current through the substrate as well as varying the amount of cooling gases introduced within each section of reactor and ranges from 300 to 1000 degree Celsius, although for the desired diffusion-limited deposition, a preferred temperature range is between 400 and 800 degree Celsius.

A long tubular CVD apparatus gives high precursor consumption and high film growth rates. Precursor gases supplied through inlet ports 19 are adsorbed onto the heated substrate and cracked via thermal energy. The desired component is deposited as a solid onto the wire, while unwanted components are desorbed and pumped out as a gas. The precursor compounds thermally decompose at pressures ranging from 5-500 torr. The thickness of the each deposited layer can be controlled by varying the length of each reactor section (typically 10 to 190 cm) and the speed of the moving substrate (typically 2 meter/minute to 200 meter/minute). Exhaust gasses are pumped through ports 20, with port maintaining separation of atmosphere between chambers. The reaction is thus envisioned as starting with an input reactant, with diffusion of gas to the wire and absorption of gas onto the wire, where the chemically reaction occurs, then desorption of byproducts and diffusion out as exhaust gas.

A CVD reactor with up to 15 sections is envisioned in order to deposit the multiple cathode, electrolyte, anode and current collector layers required for an optimized electrochemical cell. Different sections 21-29 of the reactor for the different layers may be separated by using an argon curtain. Argon gas is pumped in at the boundaries of the reactor chamber sections and evacuated after flowing across the reactor. Physical separators could also be used, provided they don't interfere with the drawing of coated wire through the successive sections. Tensioners 15 may be used to control the tension of the wire and the substrate feed and collected on reels 11 and 13. A differential pressure and argon curtain or vacuum chamber based mechanism is used to provide atmospheric isolation of reaction chamber.

Film thicknesses may be monitored by in situ laser measurement using a He—Ne laser and observing interference fringes from incident light reflecting off of the film surface and underlying surfaces. Post-deposition film thicknesses may be checked after the wire leaves the reactor using a micrometer or automatically using lasers, and deposition parameters of the reactor sections adjusted as needed. Film thickness is controlled by varying wire speed, reactor temperature, pressure and gas flow rates, reactant/inert gas mixtures and the like. The lengths of the various chamber sections are also designed in advance to obtain approximate deposition thicknesses of various layers, with the aforementioned other parameters being adjustable in process. In general, deposition rates and therefore resulting film thicknesses, increase with increasing temperature due to more thermal energy. If the deposition process is diffusion-limited (which is temperature dependent), decreasing the speed of the wire through the reactor should also thicken the coatings due to more time in the reactor.

Electrodes may be scaled on several levels. First, the capacity for a given length of "wire" may be increased by increasing the thickness of the electrodes. However, there is a limit to the electrode thickness that is determined by the electronic and ionic conductivities and ionic diffusivities in the electrode matrix. Next, the capacity can be increased by simply increasing the length of the wire. The wire may be fabricated into various geometries, such as woven into a cloth or wound onto a spool.

The positive and negative electrodes of a manufactured electrochemical cell may be tested in "puck" or pouch cells using a galvanostatic or constant current cycling method. Wire coated with a single electrode component (either cathode or anode) is carefully wrapped around a stainless steel wafer so that the wire forms a continuous mat across the wafer. The wire and wafer are then paired with a commercial counter electrode (usually lithium foil). The test cell also includes $LiPF_6$ electrolyte, separator, and a spring to apply pressure and achieve good contact.

The mass of the active material is estimated through the density and thickness of the coating in order to determine the current at which the desired C-rate can be achieved. Typical C-rates of 1C, C/2, C/5 and C/10 are used to test rate capability of the electrode materials.

As per the above teachings, the deposition process results in the continuous deposition of cathode, electrolyte, anode and current collector layers along the length of substrate without any provision for the electrical connections required for a functioning electrochemical cell. A unique method is presented that allows removal of deposited material exposing the substrate underneath at desired locations 31 (see FIG. 2). This allows attachment of electrical connections to the conductive substrate and fabrication of an electrochemical cell of the desired length. In one embodiment, the thin film solid state battery consist of length to diameter ratio (L:D) greater than 4000:1. This is achieved by modifying the surface energy and chemistry of the substrate at selected locations such that coating does not adhere (bond) to the substrate. This allows debonding of deposited material from the substrate at locations 31 where the surface energy was modified due to thermal stresses that arise as the substrate cools as it exits the reactor. The surface energy of the substrate at the desired locations can be modified with traditional methods such as sand blasting to impart a tensile stress state or applying an evaporative dye. The distance between the debonded or exposed section along the length of the substrate can vary as per the required electrode length.

Using the process described above, a unique solid state electrochemical cell (see FIG. 3) is formed by sequentially depositing concentric layers onto the conductive wire substrate 1 consisting of an (optional) adhesion/reaction barrier 2, a positive electrode or cathode 3, a solid state electrolyte 4, a negative electrode or anode 5, and outermost current collector 6. In such electrochemical cell structure, the electrolyte layer 4 performs both as an ion conductor and an electronic insulator between the positive and negative electrodes 3 and 5. In the examples given here, the cathode is formed first, while the anode is the outermost electrode. However, in another embodiment, the anode may be formed first, while the cathode would then form the outermost of the two electrodes.

Referring to FIGS. 1 and 2, in one embodiment of the concentric layers of active component of solid state Li-ion battery is formed onto an electrically conductive substrate using the following steps:

1. Modification of the surface energy of the substrate at selected locations along the length prior to entering the deposition section of the reactor (e.g. in cleaning chamber 21);
2. Resistive heating of the substrate and etching of the native oxide (if any);
3. (Optional) Nucleation and concentric growth (in deposition chamber section 22) of an electrically conductive thin layer on to the heated substrate serving the purpose of providing an adhesion layer (bonding layer) and a reaction and diffusion barrier function between the substrate and the subsequent coating;
4. Nucleation and concentric growth (in deposition chamber section 23) of a positive electrode layer onto the bond layer (or directly onto the substrate if the bonding layer is not used);
5. An optional in-situ elevated thermal annealing of deposited positive electrode (in annealing chamber section 24) to produce the desired crystal structure or chemical composition (in this example, the positive electrode or cathode is grown inside the electrolyte layer and the negative electrode or anode);
6. Nucleation and concentric growth (in deposition chamber section 25) of an electrolyte layer electrode onto the positive electrode layer;
7. Nucleation and concentric growth (in multiple deposition chamber sections 27) of the negative electrode onto the electrolyte layer (here the anode is the outer of the two electrodes);
8. Deposition (in chamber 29) of a negative electrode current collector electrode onto the anode using precursors of conductive metals or alloys of elements such as Al, Ag, Ti, Cu, or W (note: this outermost layer also functions as a hermetically sealing layer);
9. Debonding of deposited coating from the substrate at selected location during cool down at the exit section of reactor exposing the substrate; and
10. Sectioning of the coated substrate at exposed sections to create a solid state battery. We define such battery as "individual battery element".

Figure 3:
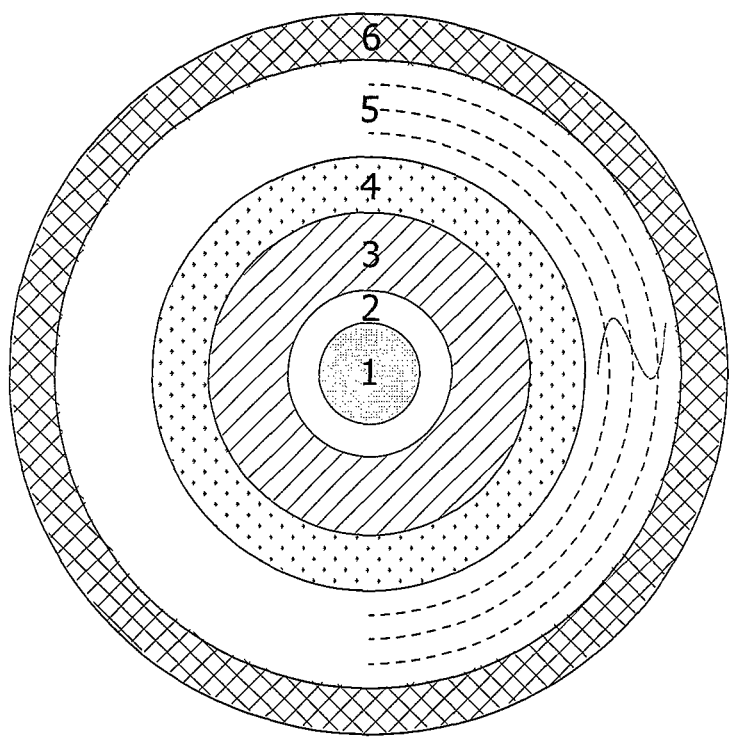
FIG. 3 shows an end view of a solid state electrochemical cell structure consisting of adhesion layer/reaction barrier layer, positive electrode, electrolyte, multilayer negative electrode structure and current collector.

In an embodiment, as depicted in FIG. 3 the negative electrode component 5 of a solid state Li-ion battery consisting of multiple layers is formed over electrolyte layer 4 using traditional carbon and silicon precursors using the following process steps:

1. Modification of the surface energy of the substrate at selected locations along the length prior to entering the multi-section deposition chamber 27 of FIG. 1;
2. Resistively heating of substrate and hydrogen etching of the native oxide (if any) in reactor section 1;
3. Nucleation and concentric growth of an electrically conductive thin layer in reactor section 2 on to the heated substrate serving the purpose of providing an adhesion layer (bonding layer) and a reaction and diffusion barrier function between the substrate and the subsequent coating (optional);
4. Nucleation and concentric growth of positive electrode layer onto the bond layer (or onto the substrate), in reactor section 3;
5. An optional in-situ elevated thermal annealing of deposited positive electrode to induce desired level of crystallization in oxygen or desired environment, in reactor section 4;
6. Nucleation and concentric growth of ion exchanging electrolyte layer electrode onto the positive electrode layer, reactor section 5;
7. Nucleation and concentric growth of multilayer silicon-carbon based negative electrode on to the electrolyte layer using the following sub-steps and depicted in FIG. 3 (note: as before, steps 4-5 and 7 may be reversed such that the anode microstructure is formed first, while the cathode forms the outer electrode):
   a. Deposition of the carbon layer serving both as stress compliant layer as well active material layer capable of intercalating-deintercalating;
   b. Deposition of the silicon layer serving function of an active material layer capable of intercalating-deintercalating;
   c. Repeat step 7-8 in subsequent sections of reactor to create multilayer negative electrode structure as required by application consisting of alternating layers of silicon and carbon; and
   d. Final deposition of a carbon layer serving function of reaction barrier between silicon and top current collector;
8. Debonding of deposited coating from the substrate at selected location during cool down at the exit section of reactor exposing the substrate;
9. Sectioning of coated substrate at exposed section to create a solid state battery with aspect ratio greater than 4000:1. We define such battery as "individual battery element".

This unique solid state battery fabrication method offers the advantages of facile and reliable manufacturing processes and improved functional capability compared to traditional flat substrate based battery manufacturing methods.

Figure 4A:
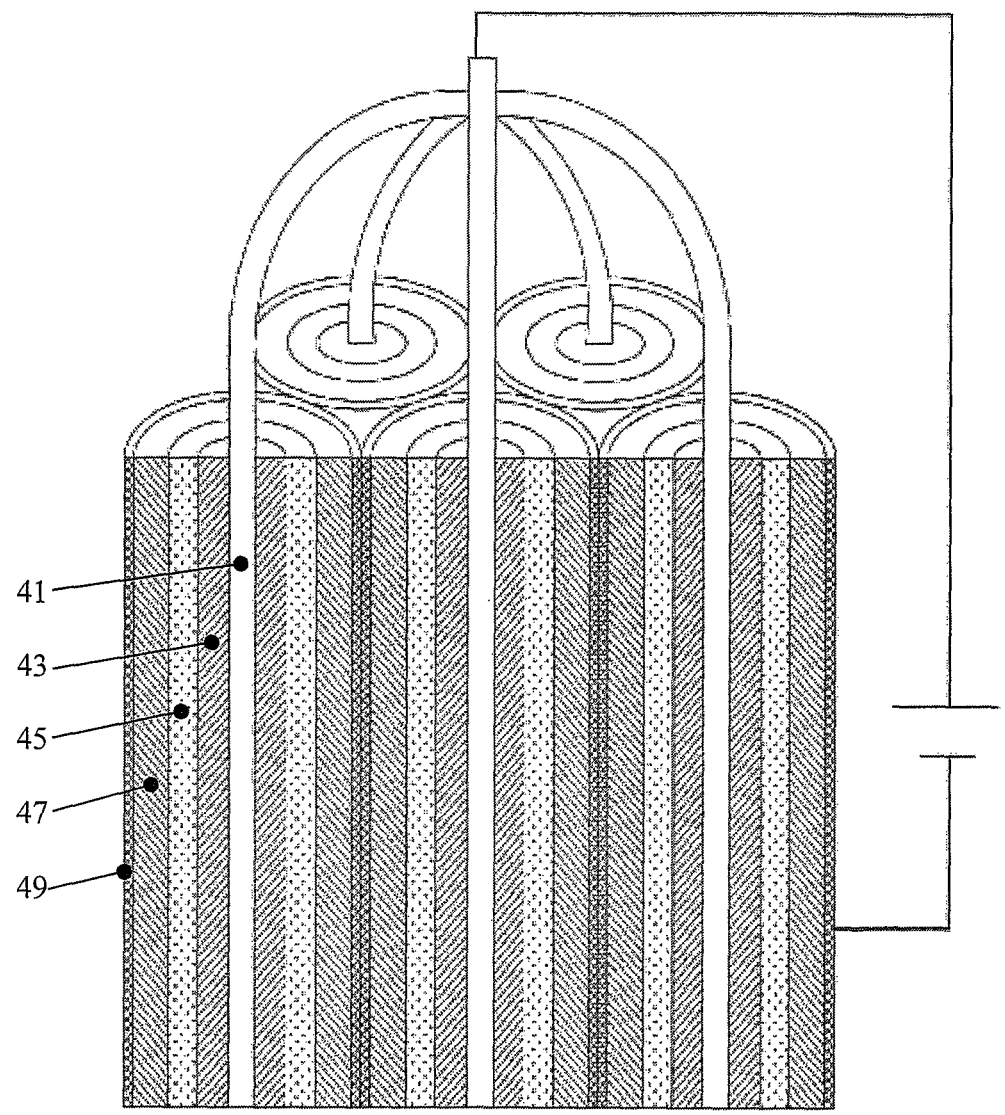
FIG. 4a is a sectioned schematic side view of a solid state electrochemical cell device where individual battery elements are bundled together such that the outer most negative electrode current collectors are in electrical contact all other negative electrode current collectors and connected to the external negative terminal while all substrate ends are connected at the external positive terminal.

Fabrication and Assembly of a High Energy Density Solid State Battery with a Fail-Safe Mechanism The resulting electrochemical cell, shown by way of example in FIG. 4a, comprises positive and negative electrodes (cathode and anode) 43 and 47 which store electrochemical energy, and other elements such as current collectors 41 and 49, and electrolyte 45, as well as separators, external terminals and packaging. Note that the anode and cathode positions can be reversed.

Current solid state thin film batteries have low energy density due to thickness limitation imposed by lithium diffusion limitations and thin film manufacturing process. Thus, current solid state batteries typically have low energy density compared with those with liquid electrolyte. Present invention teaches a method to create a high energy density solid state battery without impacting power density.

Figure 4B:
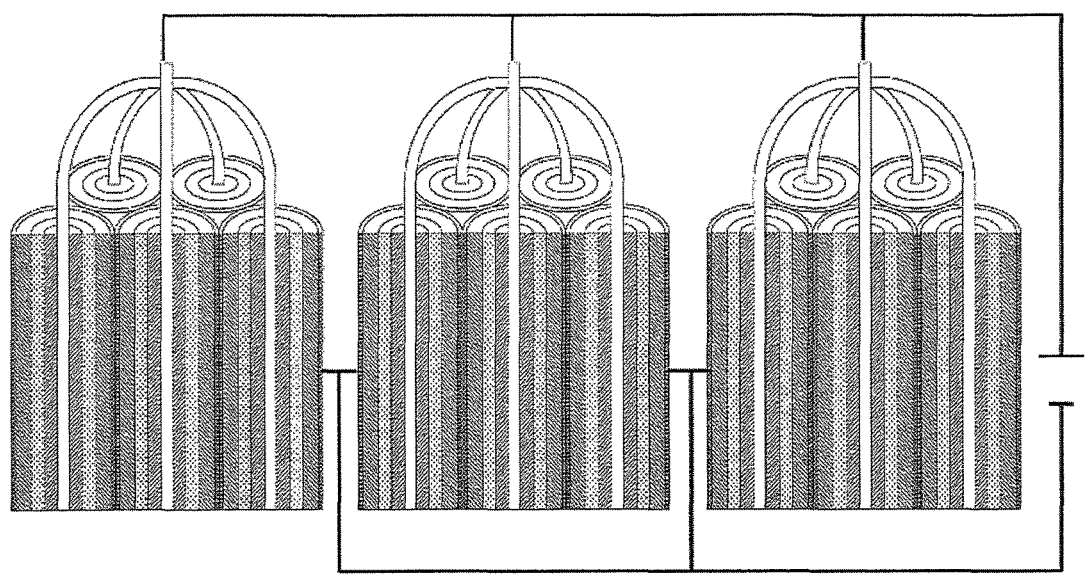
FIG. 4b is a sectioned schematic side view of a solid state electrochemical cell device where multiple bundles of individual battery elements are combined by connecting them in parallel.

It is difficult to scale up current SSBs to large capacities. The present invention offers a facile route to scale up SSBs to large capacities. A battery is an assembly of cells in series and parallel configuration to obtain the voltage and Ah capacity requirement for a given application. The battery voltage is equal to the cell voltage times the number of cells in series, while the battery capacity is equal to the cell capacity times the number of cells in parallel. Thus, one example of a battery may be assembled by connecting together the wire substrates of multiple cells and likewise their corresponding outer current collectors to assemble those cells in parallel, as seen for example in FIG. 4a, and then connect multiple versions of such assemblies in series to obtain the required voltage. In one embodiment hundreds of low capacity battery elements are assembled together where negative current collectors 49 of individual battery elements are in electrical contact and connected to an electric terminal while the exposed substrates (i.e., positive current collectors) 41 of the individual battery elements at both ends are connected to second electric terminal (FIG. 4a). This creates a high capacity battery in a bundle form. For example, one hundred individual battery elements each with 1 mAh energy density maybe connected as per FIG. 4a to create a single bundle (bundle-A) with a capacity of 100 mAh. Ten of these individual 100 mAh battery bundle-A are then further connected in parallel to create a 1 Ah battery, FIG. 4b. To achieve desired voltage required for a particular application, 1 Ah bundles can be connected in series.

Figure 5A:
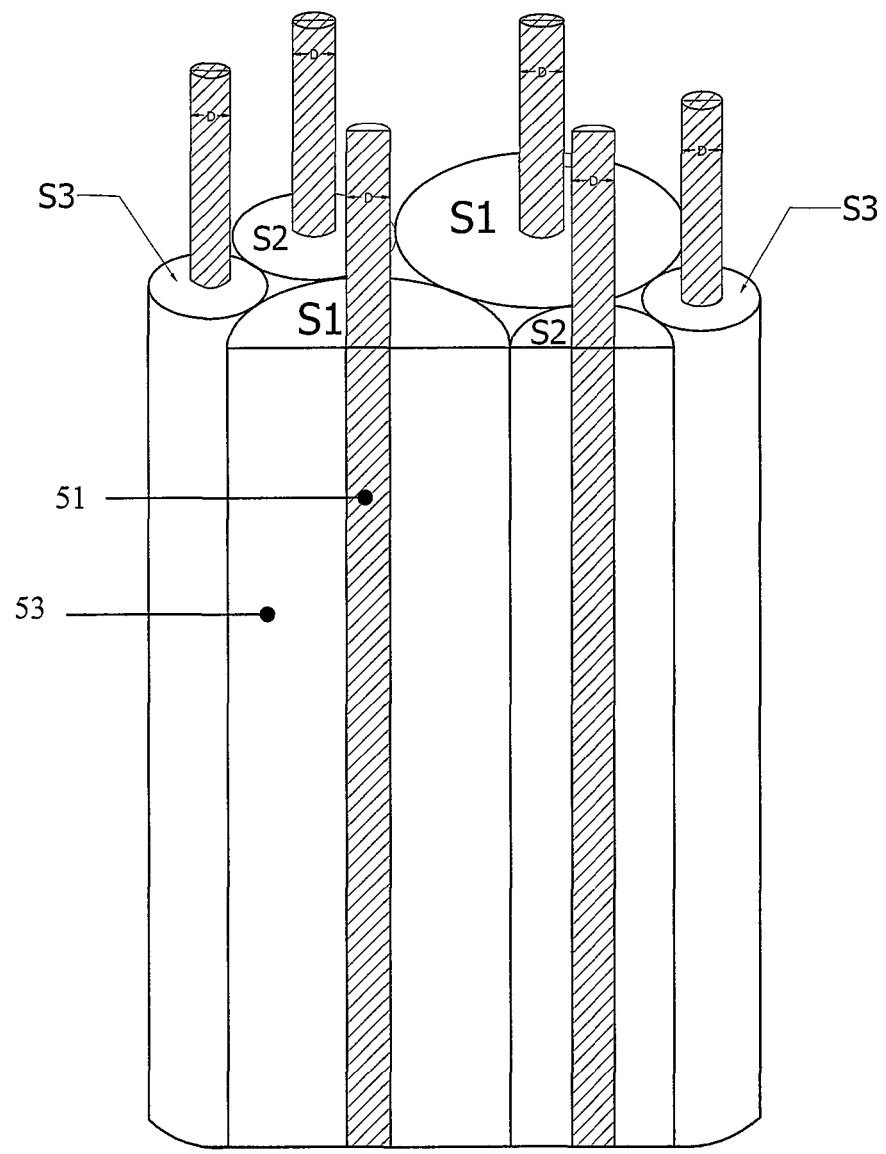
FIG. 5a is a longitudinal cross section view of solid state electrochemical cell device where individual battery elements within the bundle has the substrate diameter while the thickness of active layers vary e.g., thickness S1>S2>S3.
Figure 5B:
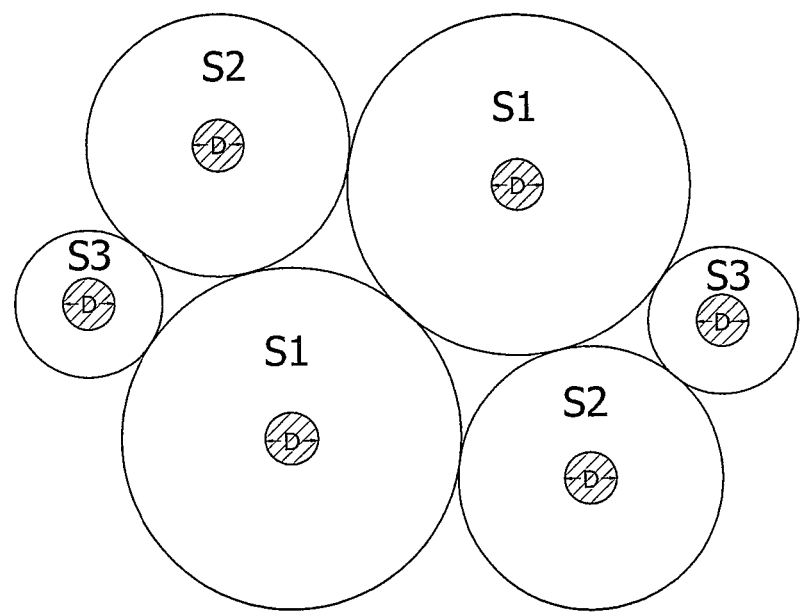
FIG. 5b is a top view of a solid state electrochemical cell device where individual battery elements within the bundle has the substrate diameter while the thickness of active layers vary e.g., thickness S1>S2>S3.

In this invention, the modular nature of assembling bundles provides the capability to optimize cell design on multiple parameters simultaneously by varying the diameter D of the wire substrate 51, thin-film coating thicknesses S1, S2, S3, and thin-film coating structures. For example, as depicted in FIGS. 5a and 5b, the proposed assembling method allows use of multiple thickness of active component 53 resulting in a cascading power output with thinner battery element discharging more rapidly than thicker battery element. Thus, this invention enables assembly of various combinations of individual battery elements allowing a nearly infinite capability to tune capacity and charge-discharge rates for specific applications.

Figure 6A:
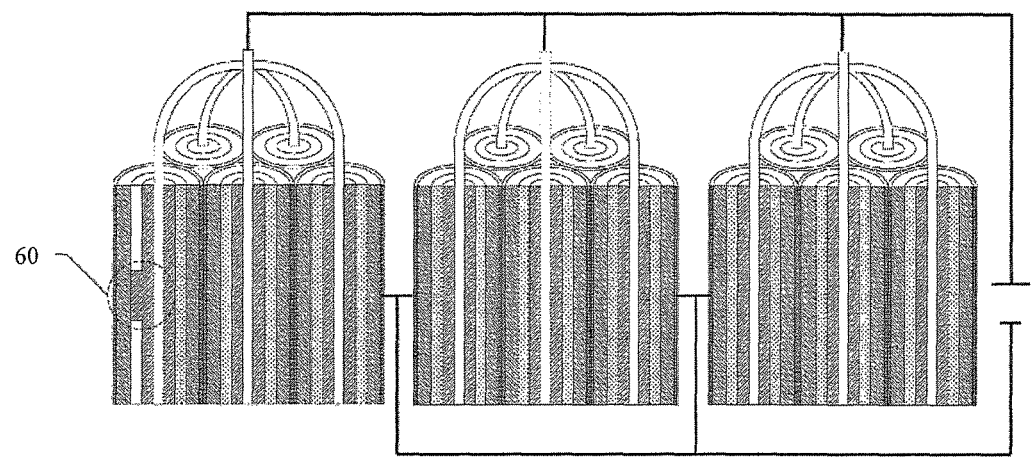
FIG. 6a is a sectioned schematic side view depicting an anode-cathode short of an individual battery element within a bundle.
Figure 6B:
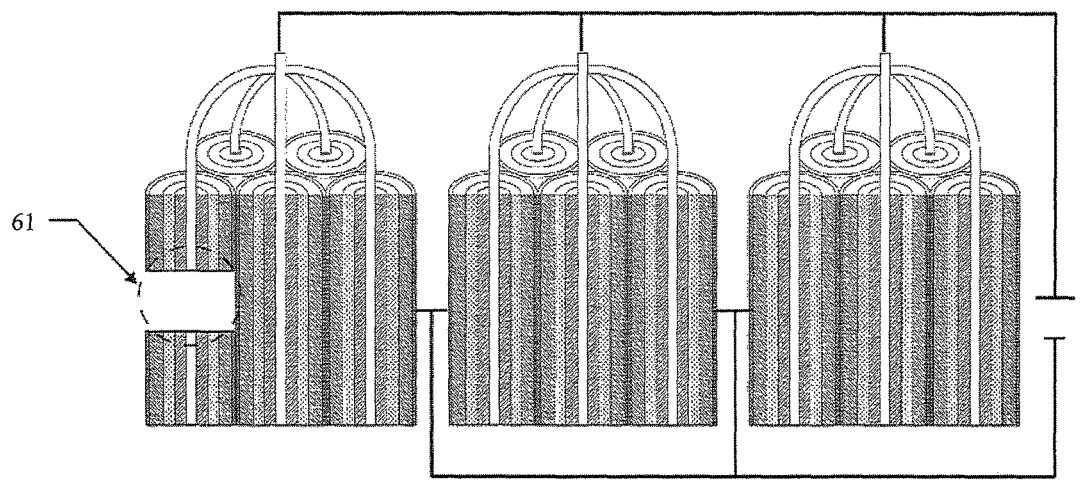
FIG. 6b is a sectioned schematic side view depicting fail-safe battery designs where an individual battery element within a bundle opens at shorted section creating an open circuit allowing other elements of function.

There have been many incidents reported when a lithium ion battery overheated and caught fire or exploded. Thus, existing liquid electrolyte lithium ion cells require external protection circuitry to prevent thermal runaway. These external protection circuits are not fail-safe and also reduce the volumetric efficiency of a given cell and often require parasitic current draw from the cell which is being protected. This invention in an embodiment allows fabrication of damage tolerant and inherently safe solid state electrochemical cell structure. This is achieved by applying the principle of a "thermal cutoff switch" or fuse mechanism to the individual battery elements. As depicted in FIG. 6a, in the event of anode-cathode shorting 60 of individual battery element, all the current will flow through the shorted individual battery element. The local increase in current density causes a rapid increase in the temperature of the substrate of the shorted electrochemical cell within the bundle, resulting in instantaneously melting of the substrate in the proximity of the short. Thus, the low resistance electrical path between the positive and negative electrode (i.e. the short) will be destroyed (at 61), as depicted FIG. 6b. After the removal of that shorted battery element from the bundle assembly, the rest of the battery elements will continue to function although with reduced capacity. The current carrying capacity (ampacity) of the substrate of individual battery element within the bundle, diameter of the substrate and the energy density or capacity of a electrochemical cell are critical factors that can be adjusted to utilize the teachings of this invention top make electrochemical cell as fail-safe device.

What is claimed is:

1. A battery, comprising:
a plurality of groups of electrochemical cells assembled together into one or more bundles,
each group of electrochemical cells having its own shared distinct conductive wire substrate forming an inner current collector for that group of cells, but with the cells having successive solid-state thin films concentrically nucleated and grown over a desired length of the wire substrate so as to respectively form, a first electrode layer of a selected first electrochemical active material, a solid-state electrolyte layer of a selected ion exchange material, and a second electrode layer of a selected second electrochemical active material, and an electrically conductive layer concentrically deposited over a length of the second electrode layer so as to form an outer current collector and hermetic seal for that cell, but with electrodes of each cell physically separated from electrodes of an adjacent cell by removal of deposited material to achieve desired cell lengths,
each bundle of electrochemical cells having the respective wire substrates connected together and having the respective outer current collectors connected together in direct collector-to-collector physical contact such that all cells of a given bundle are electrically connected in parallel, any of multiple bundles being in turn connected to each other in series to achieve a desired voltage and in parallel to achieve a desired charge-discharge rate and overall capacity,
wherein the conductive wire substrate of each group of cells on a shared substrate has a positive temperature coefficient resistance selected such that the substrate melts and creates an open circuit at a specified threshold current density, thereby acting as a current limiting fuse for the group of cells, all remaining electrochemical cells of groups of cells on shared substrate in a bundle remaining operative after creation of such an open circuit in any one or more groups of cells on shared substrate of that bundle.

2. The battery as in claim 1, wherein the defined cross-section of each conductive wire substrate in the bundle is a circular cross-section characterized by a diameter in a range between 15 μm and 150 μm.

3. The battery as in claim 2, wherein the diameter of each conductive wire substrate in the bundle is in a range between 20 μm and 40 μm.

4. The battery as in claim 1, further comprising an adhesion and reaction/diffusion barrier layer concentrically nucleated and grown between each wire substrate in the group and its corresponding first electrode layer.

5. The battery as in claim 4, wherein the adhesion and reaction/diffusion barrier layer is a metal selected from any one or more of silicon, tungsten, nickel, copper and iron.

6. The battery as in claim 4, wherein the adhesion and reaction/diffusion barrier layer is formed as a reaction product of constituent materials of the first solid-state thin film material and the wire substrate.

7. The battery as in claim 1, wherein one of the first or third electrochemical active material forming a cathode layer for each cell in the bundle is selected from any one of $LiTiS_2$, $LiFeS_2$, $LiV_2O_5$, $LiMO_2$, $LiM_2O_4$, $LiMPO_4$, $LiMSiO_4$, or lithium-doped $M_xO_y$, where M is any or a combination of the metallic elements selected from Ni, Co, Fe, Mn, V, Ti and Al, and wherein x>1 and y>1.

8. The battery as in claim 1, wherein the ion exchange material for the solid-state electrolyte layer of each cell in the bundle comprises any of $LiTiS_2$, $LiSiS_2$, $Li_2PO_2N$, $LiBH_4$, $LiBH_4N$, or a solid-state ion exchange material with room temperature ionic conductivity greater than $5 \times 10^{-7}$ S/cm.

9. The battery as in claim 1, wherein the first or third solid-state thin film forming an anode for each cell in the group comprises lithium metal, or an alloy of lithium with a lithium-receptive material.

10. The battery as in claim 1, wherein the first or third solid-state thin film forming an anode microstructure for each cell in the group comprises at least one pair of alternating layers of a compliant layer that absorbs volume-induced stresses and an intercalating-deintercalating layer of active material of the selected second electrochemical active material.

11. The battery as in claim 10, wherein there are up to 10 pairs of alternating layers in the microstructure.

12. The battery as in claim 10, wherein individual layers of the microstructure have a thickness in a range between 10 nm and 5 µm.

13. The battery as in claim 10, wherein the compliant layer is selected from any of boron (B) and carbon (C).

14. The battery as in claim 10, wherein the selected second electrochemical active material is any of lithium metal or a lithium-receptive material selected from any of C, Si, SiC, $TiS_2$, $V_2O_5$, Ge, Sn, Sb, Bi, Al, Zn, and Ag.

15. The battery as in claim 10, wherein each of the intercalating-deintercalating layers is formed as any of dense, porous, spherical or nanowire microstructures over the corresponding compliant layer.

16. The battery as in claim 10, wherein the anode microstructure has a thickness selected to obtain a specified ratio of cathode-to-anode capacity.

17. The battery as in claim 1, wherein the outer current collector for each cell in the group is composed of conductive material selected from any of Ti, Ge, Cu, Al, or W, a silicide or carbide thereof, or a conductive polymer.

18. The battery as in claim 1, wherein the cells in each group have one or more cell diameters that have been selected to maximize packing density of the group.

19. The battery as in claim 1, wherein the plurality of cells in each group has a selected variety of charge-discharge rates.

20. A battery of the type having a plurality of electrochemical cells assembled together into one or more bundles, each electrochemical cell formed by the process comprising:

providing an elongated CVD tube with a plurality of successive sections, each section isolated from the next by an inert gas;

heating an electrically conductive wire substrate, moving under tension through sections of the CVD tube having a diameter in the range between 15 and 150 micrometers forming an inner current collector heated to at least 400 degrees C.;

depositing by vapor deposition solid-state thin films concentrically nucleated and grown in successive sections of the CVD tube over a length of the wire substrate so as to respectively form, a first electrode layer of a selected first electrochemical active material, a solid-state electrolyte layer of a selected ion exchange material, and a second electrode layer of a selected second electrochemical active material, and an electrically conductive layer concentrically vapor deposited over a length of the second electrode layer so as to form an outer current collector and hermetic seal for that cell, with cells separated from each other along the length of the conductive wire;

bundling groups of the electrochemical cells having respective wire substrates connected together and having the respective outer current collectors connected together in direct collector-to-collector physical contact such that all cells of a given bundle are electrically connected in parallel, any of multiple bundles being in turn connected to each other in series to achieve a desired voltage and in parallel to achieve a desired charge-discharge rate and overall capacity; and wherein the conductive wire substrate has a positive temperature coefficient resistance selected such that the substrate melts and creates an open circuit at a specified threshold current density, thereby acting as a current limiting fuse for a cell, all remaining electrochemical cells of a bundle remaining operative after creation of such an open circuit in any one or more cells of that bundle.

* * * * *